United States Patent
Peng et al.

(10) Patent No.: US 7,984,823 B2
(45) Date of Patent: Jul. 26, 2011

(54) APPARATUS FOR POSITIONING FLIPPING COVER RELATIVE TO BASE AND CASING UTILIZING THE SAME

(75) Inventors: Yao-Che Peng, Guangdong (CN); Jung-Chang Tai, Guangdong (CN)

(73) Assignee: Hon Hai Precision Industry Co., Ltd., Tucheng Dist., New Taipei (TW)

( * ) Notice: Subject to any disclaimer, the term of this patent is extended or adjusted under 35 U.S.C. 154(b) by 1358 days.

(21) Appl. No.: 11/309,654

(22) Filed: Sep. 6, 2006

(65) Prior Publication Data
US 2007/0236109 A1 Oct. 11, 2007

(30) Foreign Application Priority Data
Mar. 31, 2006 (CN) .......................... 2006 1 0060130

(51) Int. Cl.
*B65D 43/16* (2006.01)
*E05C 17/64* (2006.01)
*B65D 6/28* (2006.01)

(52) U.S. Cl. .......... 220/832; 220/4.22; 220/835; 16/337

(58) Field of Classification Search .................. 220/831, 220/832, 4.21, 811–815, 4.22, 834, 835; 16/50, 259, 297, 82, 357
See application file for complete search history.

(56) References Cited

U.S. PATENT DOCUMENTS

| | | | | |
|---|---|---|---|---|
| 2,516,537 | A | * | 7/1950 | Wetzel et al. ................. 384/416 |
| 4,239,093 | A | * | 12/1980 | Eubanks et al. .............. 190/106 |
| 4,356,594 | A | | 11/1982 | Grosemans |
| 4,460,105 | A | * | 7/1984 | Cox ............................. 220/830 |
| 4,562,566 | A | | 12/1985 | Eisemann |
| 5,341,357 | A | | 8/1994 | Mukawa et al. |
| 5,570,493 | A | * | 11/1996 | Gulick ............................. 27/18 |
| 6,128,265 | A | | 10/2000 | Leung |
| 2005/0229195 | A1 | | 10/2005 | Liu |
| 2006/0026613 | A1 | | 2/2006 | Mao et al. |

FOREIGN PATENT DOCUMENTS

| CN | 2453754 Y | 10/2001 |
|---|---|---|
| DE | 20103909 | 6/2001 |

* cited by examiner

*Primary Examiner* — Robin Hylton
(74) *Attorney, Agent, or Firm* — Winston Hsu; Scott Margo

(57) ABSTRACT

An apparatus, for positioning a flipping cover relative to a base, includes a first member being fixed relative to the flipping cover, and a second member being fixed relative to the base. The first member defines an arched guiding channel around a rotating axis of the flipping cover. The first member forms at least one raised ridge extending into the guiding channel. The second member forms a guiding rod parallel to the rotating axis. The guiding rod is slidably received in the guiding channel. The guiding rod is deformable to get through the at least one raised ridge. A casing utilizing the above apparatus is also disclosed.

3 Claims, 6 Drawing Sheets

APPARATUS FOR POSITIONING FLIPPING COVER RELATIVE TO BASE AND CASING UTILIZING THE SAME

FIELD OF THE INVENTION

The present invention generally relates to apparatuses for positioning flipping covers and, more particularly, to an apparatus for positioning a flipping cover at a desired position and a casing utilizing the same.

DESCRIPTION OF RELATED ART

Most electronic devices are with releasable casings. That is, each of the casings includes a base and a flipping cover releasable from the base. The flipping cover is applied by an external force to flip-open relative to the base. A torsion spring or the like is utilized to apply a force opening the flipping cover.

However, the flipping cover is prone to ricocheting/wobbling back and forth when reaching a largest opening angle. It is because that the flipping cover cannot be properly positioned and stabilized.

Accordingly, a need exists for an apparatus for positioning and stabilizing a flipping cover and a casing utilizing the same in the industry.

SUMMARY OF THE INVENTION

An apparatus, for positioning a flipping cover relative to a base, includes a first member being fixed relative to the flipping cover, and a second member being fixed relative to the base. The first member defines an arched guiding channel around a rotating axis of the flipping cover. The first member forms at least one raised ridge extending into the guiding channel. The second member forms a guiding rod parallel to the rotating axis. The guiding rod is slidably received in the guiding channel. The guiding rod is deformable to get through the at least one raised ridge.

An apparatus, for positioning a flipping cover relative to a base, includes a first member being fixed relative to the flipping cover, and a second member being fixed relative to the base. The first member defines a guiding channel. The first member forms at least one raised ridge extending into the guiding channel. The second member forms an split knob with a diameter thereof greater than a width of the guiding channel. The split knob is slidably received in the guiding channel, and deformable so as to get through the at least one raised ridge to move from a segment to another segment of the guiding channel.

A casing includes a base, a flipping cover pivotably attached to the base, a first member fixed to the flipping cover, and a second member fixed to the base. The flipping cover is rotatable around a rotating axis. The first member defines a guiding channel around the rotating axis. The first member forms at least one raised ridge extending into the channel to narrow a width of the channel adjacent an end thereof. The second member includes an split knob slidably received in the guiding channel. The split knob is elastically deformable to get through a part of the guiding channel where the at least one raised ridge lies.

Other systems, methods, features, and advantages of the present apparatus for positioning a flipping cover and the present casing will be or become apparent to one with skill in the art upon examination of the following drawings and detailed description. It is intended that all such additional systems, methods, features, and advantages be included within this description, be within the scope of the present apparatus, and be protected by the accompanying claims.

BRIEF DESCRIPTION OF THE DRAWINGS

Many aspects of the present apparatus for positioning a flipping cover and the present casing can be better understood with reference to the following drawings. The components in the drawings are not necessarily to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe the preferred embodiments of the present apparatus for positioning a flipping cover and the present casing, in detail.

Figure 1:
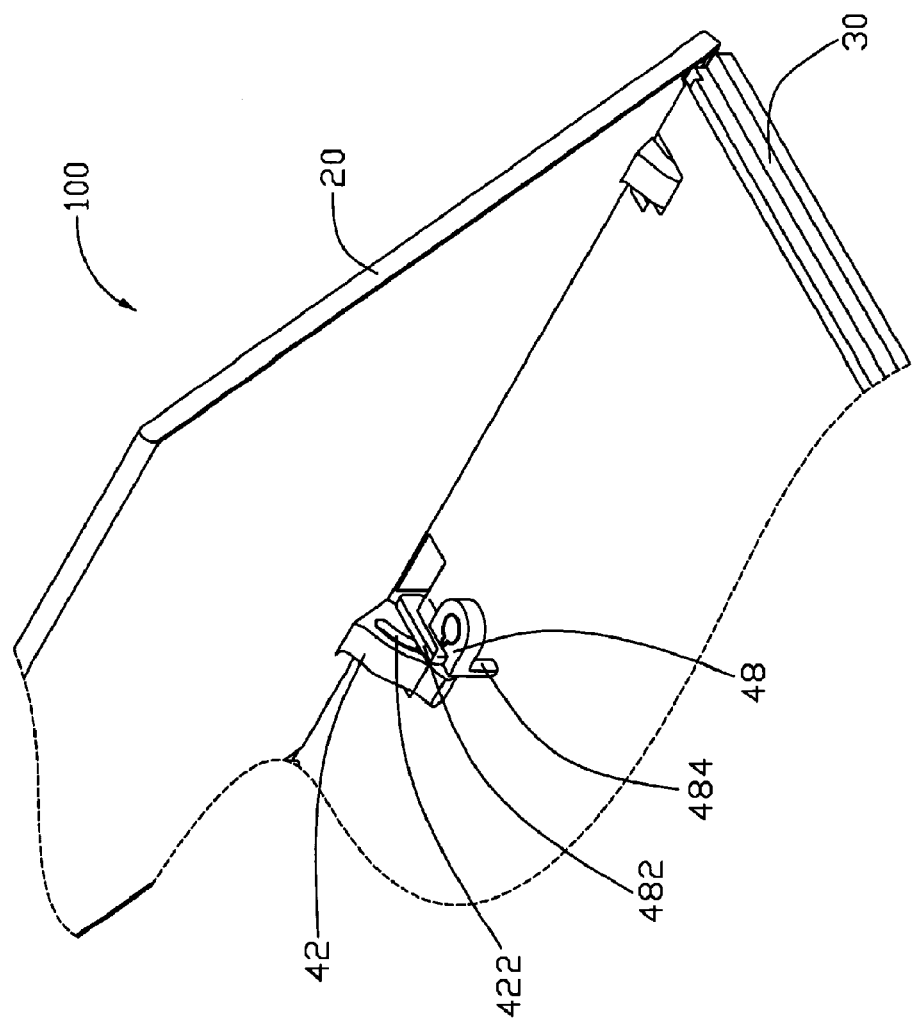
FIG. 1 is an isometric view of a casing, the casing including a first member and a second member.

Referring to FIG. 1, a casing 100 in accordance with a first embodiment is illustrated. The casing 100 includes a flipping cover 20 and a base 30. The flipping cover 20 is pivotably attached to the base 30 along a rotating axis. A first member 42 is formed on the flipping cover 20 near the rotating axis. A second member 48 is fixed to the base 30. The first member 42 and the second member 48 engage with each other while rotating the flipping cover 20, thus, the flipping cover 20 is guided to reach a predetermined opening angle.

Figure 2:
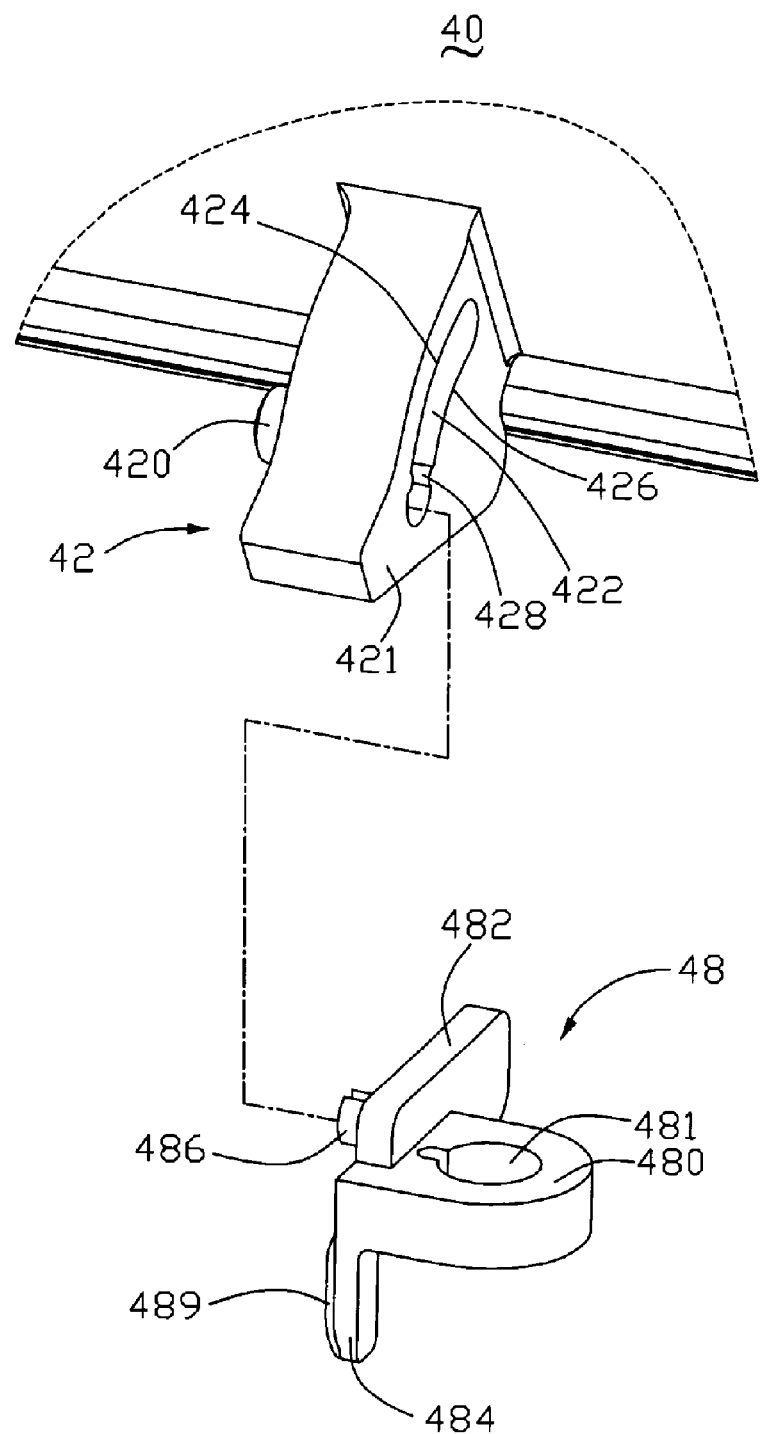
FIG. 2 is an exploded view of the first member and the second member.

Referring to FIG. 2, the first member 42 is substantially quadrant shape with a tip 421 extending from a corner thereof. A shaft 420 extends from the first member 42 along the rotating axis and inserted into the base 30, thus, pivoting the flipping cover 20 to the base 30 and allowing the flipping cover 20 to rotate around the shaft 420 with respect to the base 30. The first member 42 defines a guiding channel 422 that arcs around the rotating axis. The guiding channel 422 is bounded by a first cambered surface 424 and a second cambered surface 426. The first and second cambered surfaces 424, 426 are coaxial and have different radius. Each of the first cambered surface 424 and the second cambered surface 426 forms a raised ridge 428 thereon. The raised ridges 428 face each other. Therefore, a distance between the first cambered surface 424 and the second cambered surface 426, i.e. a width of the guiding channel 422, is greater than a distance between the raised ridges 428. The raised ridges 428 are disposed near an end of the guiding channel 422, i.e., the end is furthest from the flipping cover 20.

Figure 3:
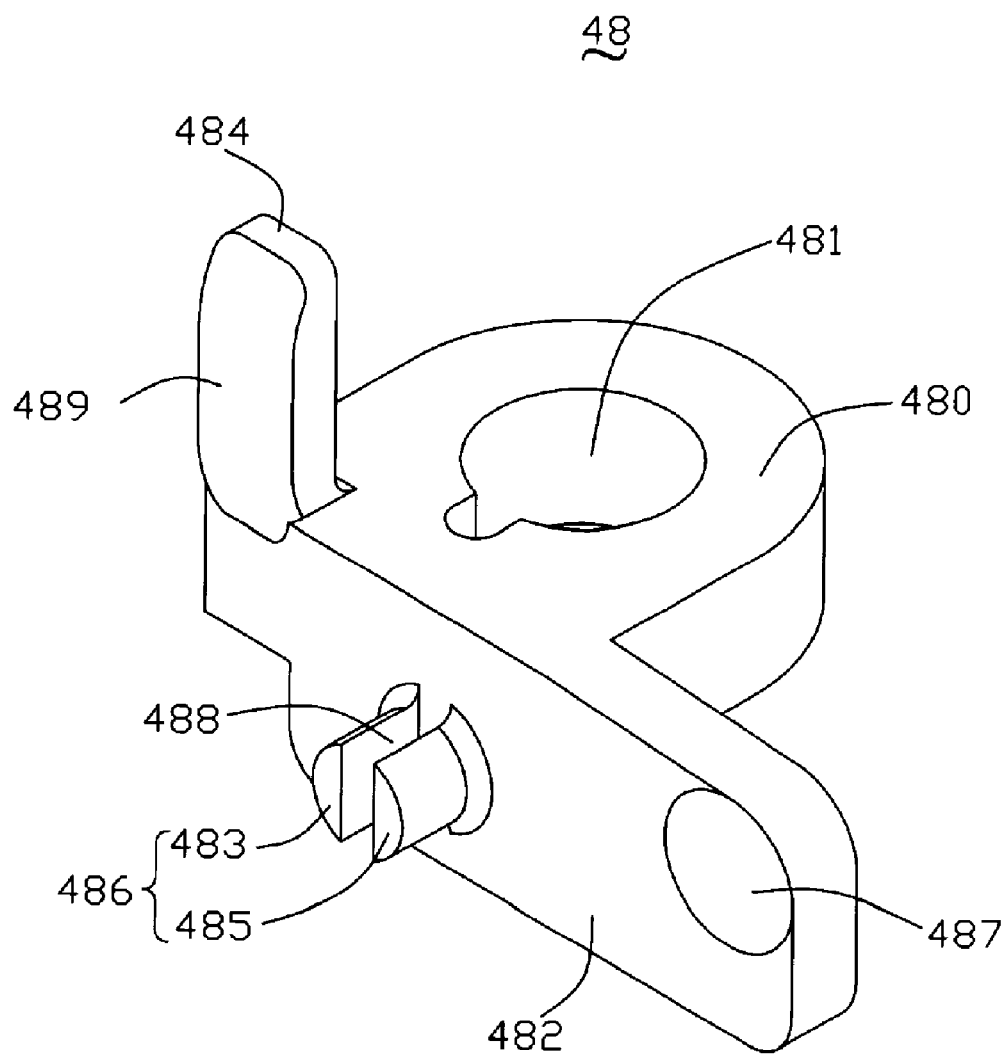
FIG. 3 is an enlarged view the second member, but viewed from another aspect.

Referring also to FIG. 3, the second member 48 includes a main body 480, an extending plate 482, and an elongated arm 484. The extending plate 482 and the elongated arm 484 extend from an edge of the main body 480 along two perpendicular directions. The extending plate 482 engages with the first member 42 to guide the flipping cover 20. The elongated arm 484 interferes with the first member 42 to decelerate the rotating velocity of the flipping cover 20 during opening of the flipping cover 20.

Figure 4:
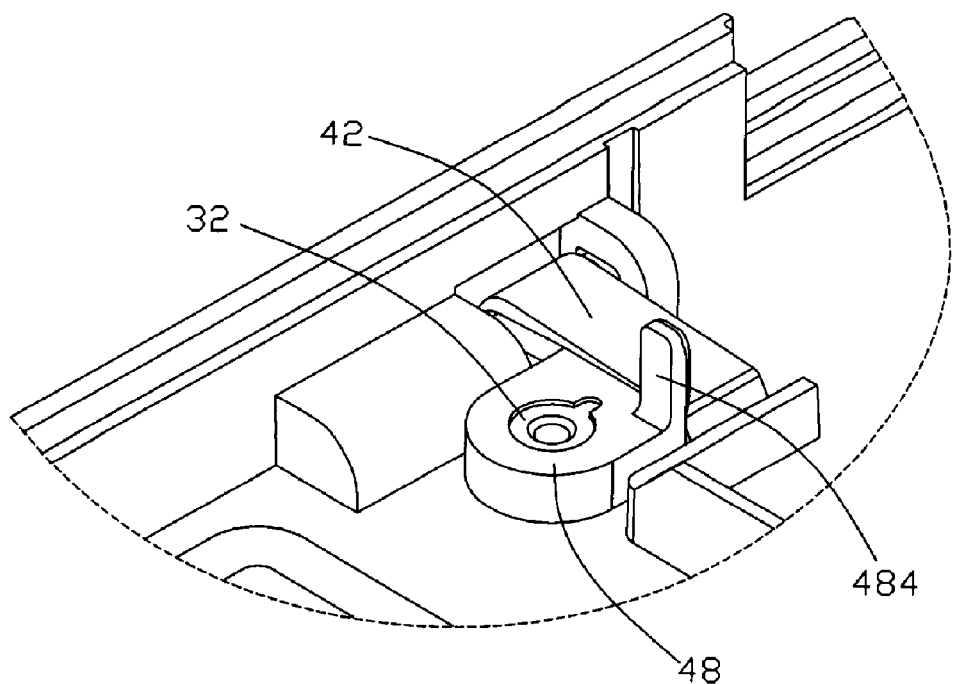
FIG. 4 is an assembled view of the casing from an inverted aspect.

A fixing hole 481 is defined in a center of the main body 480. The fixing hole 481 is in a non-revolvable shape to position the second member 48 to the base 30. Referring to FIG. 4, the second member 48 is disposed on the base 30 and sleeved on a positioning pin 32 of the base 30, thus, the second member 48 is secured to the base 30.

A contacting protrusion 487 protrudes from the extending plate 482. The contacting protrusion 487 is in contact with the first member 42, to define a contact point therebetween. The contact point is on the rotating axis of the flipping cover 20. A split knob 486 extends from the extending plate 482 towards the guiding channel 422 of the first member 42. A diameter of the split knob 486 is smaller than the width of the guiding channel 422, and is greater than distance between the raised ridges 428. That is, the diameter of the split knob 486 is configured to be in a range between the width of the guiding channel 42 and the distance of the raised ridges 428. The split knob 486 is received in the guiding channel 422 to guide the flipping cover 20 while opening. The split knob 486 is divided into a first portion 483 and a second portion 485 by a split 488 defined along an extended diameter thereof. The first portion 483 and the second portion 485 are elastically deformable to converge toward the split 488, so the split knob 486 can pass through the raised ridges 428 in the guiding channel 422.

The elongated arm 484 includes a curved surface 489 that protrudes toward the first member 42. The curved surface 489 interferes with the tip 421 of the first member 42. The angular velocity of the flipping cover 20 tends to decrease under the coopertion between the curved surface 489 and the tip 421 so as to eliminate wobbles/reverberates thereof during opening The flipping cover 20.

When opening, the flipping cover 20 is released under a releasing force, applied by, for example, a torsion spring. The flipping cover 20 is flipped to open from the base 30 relative to the rotating axis. The first member 48 rotates with the flipping cover 20 causing the guiding channel 422 of the first member 42 to slide around the split knob 486. That is held stationary and causes the curved surface of the elongated arm 484 to rub/interfere against the tip 421 of the first member 42 that is rotating. An angular velocity of the flipping cover 20 with respect to the base 30 thus decreases due to a force applied by the elongated arm 426 on the first member 42, thus, eliminating/depressing wobbles thereof. As the flipping cover 20 is opened toward the largest opening angle, the split knob 486 reaches the raised ridges 428 in the guiding channel 422. The first portion 483 and the second portion 485 deform and converge toward the split 488 to get through the raised ridges 428 to reach the largest opening angle. When the flipping cover 20 reaches the largest opening angle, the split knob 486 is supported the raised ridges 428 for holding the flipping cover 20 and stabilizing flipping cover 20 at the largest opening angle.

When closing, an external force is applied to the flipping cover 20, and the raised ridges 428 force the split knob 486 to be deformed to get therethrough. Subsequently, the flipping cover 20 continues closing with the guiding channel 422 sliding around the split knob 486, until the flipping cover reaches the base 30.

Figure 5:
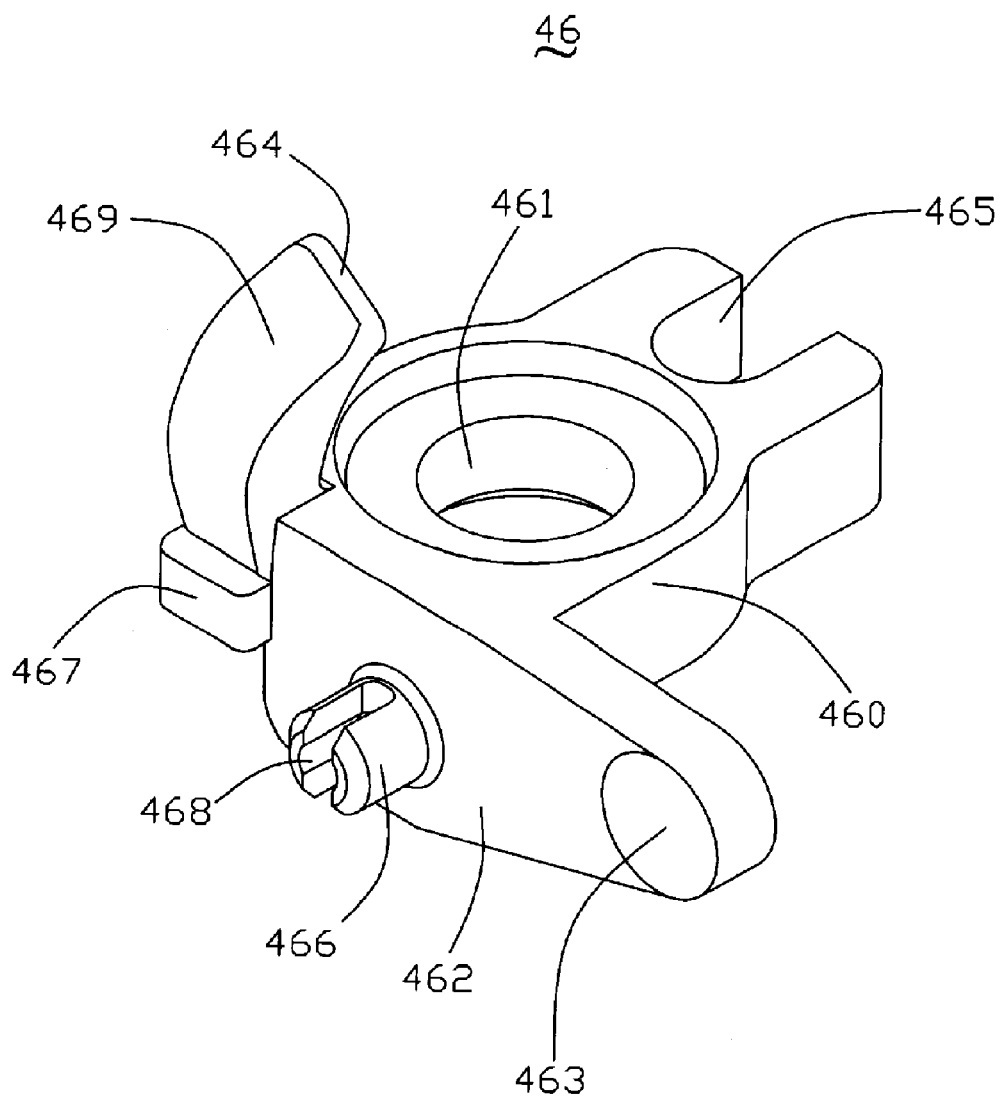
FIG. 5 is a second member in accordance with a second embodiment.
Figure 6:
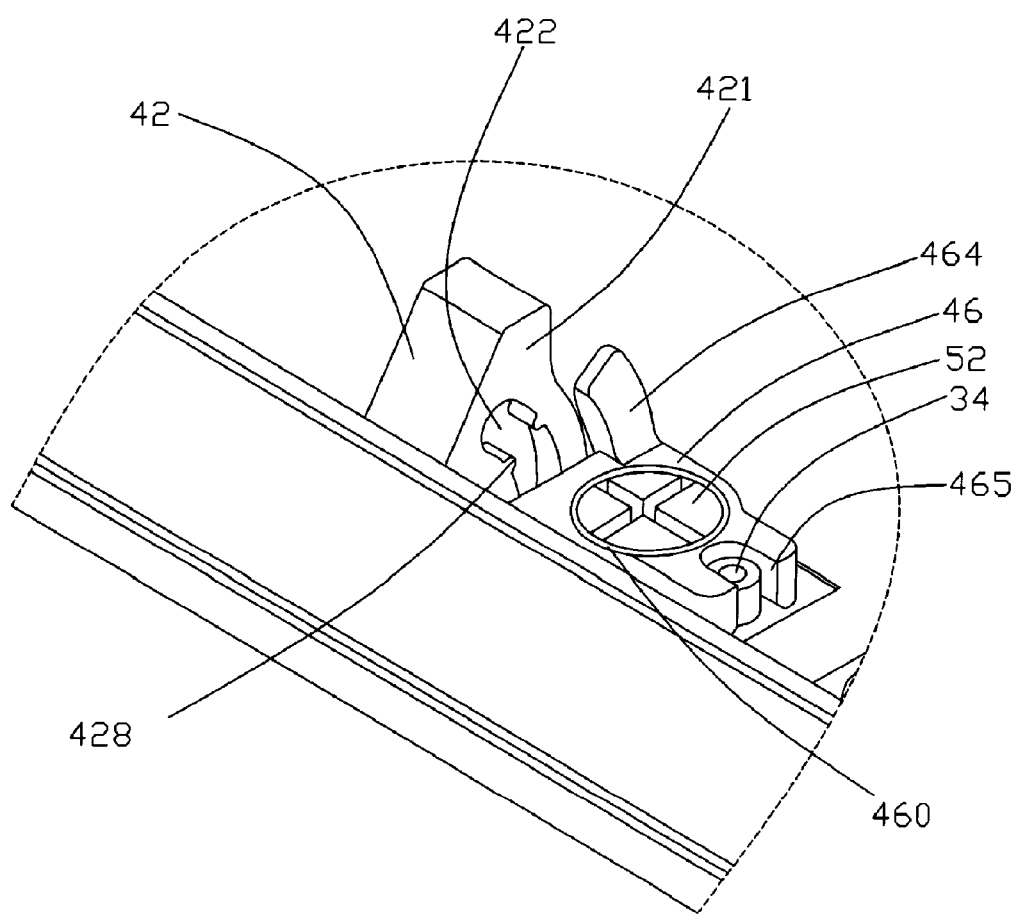
FIG. 6 is an assembled view of a casing with the second member in FIG. 5 from an inverted aspect.

Referring to FIG. 5 and FIG. 6, a second member 46 in accordance with a second embodiment is illustrated. The second member 46 includes a main body 460, an extending plate 462, and an elongated arm 464.

The main body 460 defines a central hole 461 in a center thereof and a cutout 465 at a side thereof. The second member 46 is secured to the base 30 by a screw 52 through the central hole 461. A positioning pin 34 formed on the base 30 is received in the cutout 465 to position the second member 46 and prevent it from drifting.

The extending plate 462 includes a contacting protrusion 463 and a split knob 466. The contacting protrusion 463 resists against the first member 42 of the flipping cover 20 to define a contact point therebetween on the rotating axis. The split knob 466 is similar to the split knob 486 in the first embodiment, but defines a round hole 468 therein to make a thickness of the split knob 468 uniform and to increase an elasticity of the split knob 466.

The elongated arm 464 is slightly bended toward the rotating axis of the flipping cover 20 to increase interference with the first member 42. The elongated arm includes a baffle 467 and a curved surface 469. The curved surface 469 interferes with the tip 421 of the first member 42 to decelerate the rotating velocity of the flipping cover 20 during the opening of the flipping cover 20. The baffle 467 resists against the tip 421 to prevent the flipping cover 20 from over-opening and to protect the split knob 466 when the flipping cover 20 reaches the largest opening angle.

In the above embodiments, the second members 48, 46 are preferred to be made of self-lubricating material, for example polyformaldehyde material. Polyoxymethylene is a kind of superior self-lubricating material with high abradability. It greatly enhances performance of the second members 48, 46. The split knobs 486, 466 slide in the guiding channel 422, and resist against the raised ridges 428 therein. The flipping cover 20 rotates steadily along the guiding channel 422 when opening, and is stabilized when reaching the largest opening angle.

Some modifications, such as omitting one of the raised ridges 428, the split knobs 486, 466 being a hollow tube shape, et. al, can be made to the above embodiments.

It should be emphasized that the above-described embodiments of the present invention, including any preferred embodiments, are merely possible examples of implementation of the principles of the invention, and are merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and be protected by the following claims.

What is claimed is:

1. A casing, comprising:
    a base;
    a flipping cover pivotably attached to the base, the flipping cover being rotatable around a rotating axis;
    a first member fixed to the flipping cover, the first member defining a guiding channel around the rotating axis, the first member forming at least one raised ridge extending into the channel to narrow a width of the channel adjacent an end thereof; and
    a second member fixed to the base, the second member comprising a split knob slidably received in the guiding channel, the split knob being elastically deformable to pass through a part of the guiding channel where the at least one raised ridge lies.

2. The casing as claimed in claim 1, wherein the split knob is circular rod with a hollow therein, and the split knob is deformable toward the hollow.

3. The casing as claimed in claim 1, wherein the second member is made of polyformaldehyde material.

* * * * *